United States Patent
Wu et al.

(10) Patent No.: US 11,430,908 B2
(45) Date of Patent: Aug. 30, 2022

(54) METHOD FOR REMOVING UNDESIRED COATING FROM FRONT FACE OF CRYSTALLINE SILICON SOLAR CELL

(71) Applicant: Zhejiang Aiko Solar Energy Technology Co., Ltd., Yiwu (CN)

(72) Inventors: Huimin Wu, Yiwu (CN); Xiaoming Zhang, Yiwu (CN); Jiebin Fang, Yiwu (CN); Kang-Cheng Lin, Yiwu (CN); Daneng He, Yiwu (CN); Gang Chen, Yiwu (CN)

(73) Assignee: ZHEJIANG AIKO SOLAR ENERGY TECHNOLOGY CO., LTD., Yiwu (CN)

( * ) Notice: Subject to any disclaimer, the term of this patent is extended or adjusted under 35 U.S.C. 154(b) by 0 days.

(21) Appl. No.: 17/227,369

(22) Filed: Apr. 11, 2021

(65) Prior Publication Data

US 2021/0234061 A1   Jul. 29, 2021

Related U.S. Application Data

(63) Continuation-in-part of application No. PCT/CN2019/098403, filed on Jul. 30, 2019.

(30) Foreign Application Priority Data

Oct. 12, 2018 (CN) .......................... 201811188840.X

(51) Int. Cl.
*H01L 31/18* (2006.01)
*H01L 31/0216* (2014.01)

(52) U.S. Cl.
CPC .... *H01L 31/1868* (2013.01); *H01L 31/02167* (2013.01); *H01L 31/1804* (2013.01)

(58) Field of Classification Search
CPC .......... H01L 31/1868; H01L 31/02167; H01L 31/1804; Y02E 10/547; Y02P 70/50
See application file for complete search history.

(56) References Cited

FOREIGN PATENT DOCUMENTS

| CN | 201853715 U | 6/2011 |
|----|-------------|--------|
| CN | 202585427 U | 12/2012 |

(Continued)

OTHER PUBLICATIONS

Wu et al., Application of ion Implantation Emitter in PERC Solar Cells, IEEE Journal of Photovoltaics, vol. 4, No. 1, pp. 52-57 (Year: 2014).*

(Continued)

*Primary Examiner* — Earl N Taylor
(74) *Attorney, Agent, or Firm* — Matthias Scholl P.C.; Matthias Scholl

(57) ABSTRACT

A method for removing an undesired coating from a front face of a crystalline silicon solar cell includes: S1: depositing an $Al_2O_3$ film, an $SiO_2$ film, and an $SiN_x$ film on a back face of a silicon wafer to form a backside passivation film, and forming an undesired coating on an edge of the front face of the silicon wafer; S2: preparing an aqueous film on a surface of the backside passivation film of the product obtained in S1; S3: passing the product obtained in S2 through an acid tank to remove the undesired coating; S4: passing the product obtained in S3 through a water tank to remove a residual treatment solution; and S5: drying the product obtained in S4.

10 Claims, 1 Drawing Sheet

(56) References Cited

FOREIGN PATENT DOCUMENTS

| CN | 103594529 A | | 2/2014 | | |
|---|---|---|---|---|---|
| CN | 103594531 A | | 2/2014 | | |
| CN | 105470348 A | * | 4/2016 | | |
| CN | 105470348 A | | 4/2016 | | |
| CN | 105845781 A | * | 8/2016 | | |
| CN | 105845781 A | | 8/2016 | | |
| CN | 106784161 A | | 5/2017 | | |
| CN | 106972079 A | | 7/2017 | | |
| CN | 106981522 A | | 7/2017 | | |
| CN | 107256898 A | * | 10/2017 | ........... | C23C 16/308 |
| CN | 107256898 A | | 10/2017 | | |
| CN | 109585597 A | | 4/2019 | | |
| JP | 2014063890 A | | 4/2014 | | |

OTHER PUBLICATIONS

Krauss et al., Light-induced degradation of silicon solar cells with aluminium oxide passivated rear side, Energy Procedia, 77, pp. 599-606 (Year: 2015).*
Hsu et al., Enhanced Si Passivation and PERC Solar Cell Efficiency by Atomic Layer Deposited Aluminum Oxide with Two-step Post Annealing, Nanoscale Research Letters, 14:139, pp. 1-10 (Year: 2019).*
Xiaojun Han, Biofunctionalization of nanoparticle surface and its application, Biofunctionalized Interfaces, Jan. 2017, p. 124, Harbin Institute of Technology Press, China.

* cited by examiner

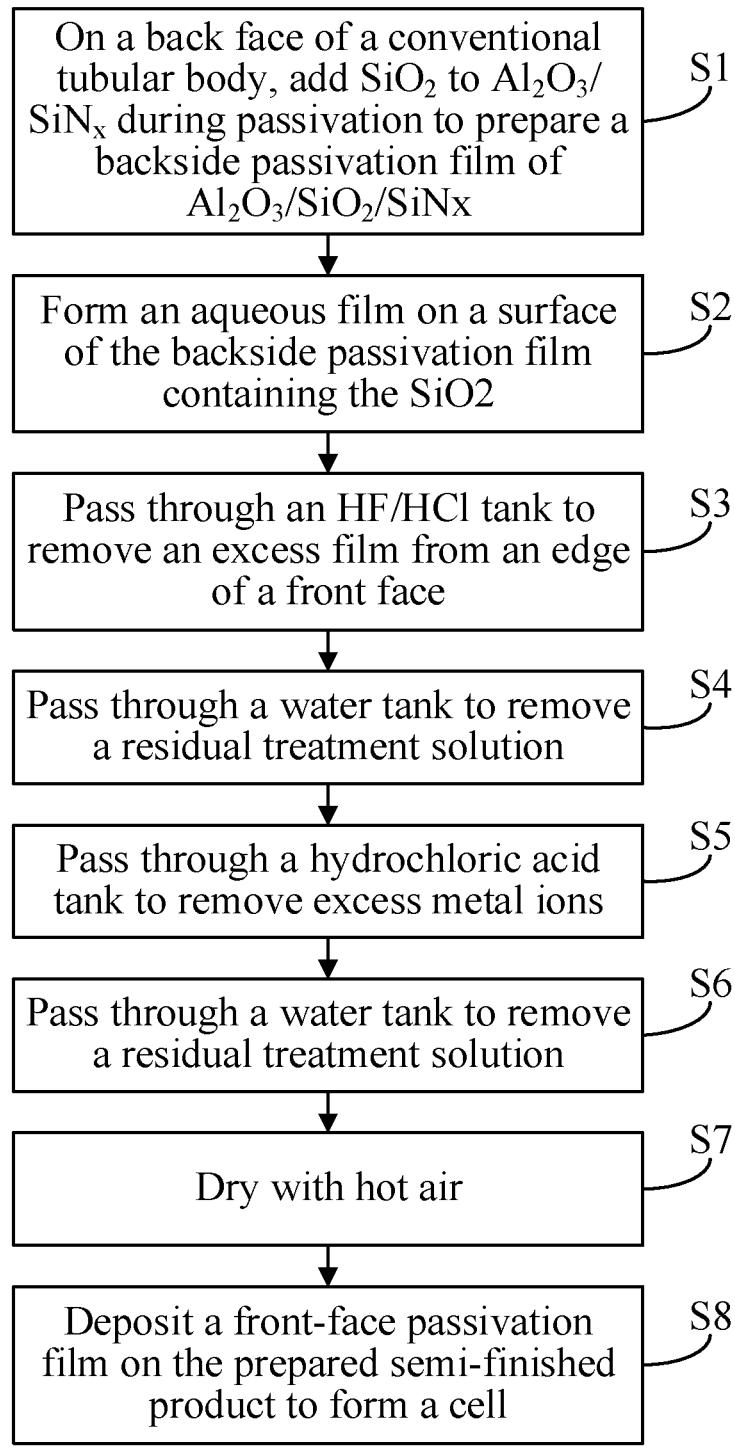

METHOD FOR REMOVING UNDESIRED COATING FROM FRONT FACE OF CRYSTALLINE SILICON SOLAR CELL

CROSS-REFERENCE TO RELAYED APPLICATIONS

This application is a continuation-in-part of International Patent Application No. PCT/CN2019/098403 with an international filing date of Jul. 30, 2019, designating the United States, now pending, and further claims foreign priority benefits to Chinese Patent Application No. 201811188840.X filed on Oct. 12, 2018. The contents of all of the aforementioned applications, including any intervening amendments thereto, are incorporated herein by reference.

BACKGROUND

The disclosure relates to the field of crystalline silicon solar cell, and more particularly, to a method for removing an undesired coating from a front face of a crystalline silicon solar cell.

For crystalline silicon cells, the passivated emitter rear cell (PERC) backside passivation technology has alleviated the problem of contact recombination between crystalline silicon and metal on a back face, and improved the photoelectric conversion efficiency of crystalline silicon cells. A tubular plasma film deposition machine used for the preparation of PERC crystalline silicon cells has been widely used because of its integrated preparation, mature process, and low costs.

In the back-face film deposition process, a silicon wafer is carried by a graphite boat and placed in the tubular plasma film deposition machine. A stuck point on the graphite boat jams the silicon wafer, and the graphite boat is in contact with a front face of the silicon wafer. Because a textured surface on the front face of the silicon wafer should not be damaged, the stuck point on the graphite boat cannot firmly jam the silicon wafer. Consequently, a backside passivation film occurs on an edge of the front face of the silicon wafer after the back-face film deposition, and an undesired coating occurs on the front face of a prepared finished cell. The undesired coating not only greatly affects the appearance of the cell, but also reduces the photoelectric conversion efficiency of the cell.

SUMMARY

An objective of the disclosure is to provide a method for alleviating a problem of an undesired coating from a front face of a crystalline silicon solar cell, to improve the appearance of the cell and the photoelectric conversion efficiency of the cell.

The objective of the disclosure is achieved using the following technical solution: A method for removing an undesired coating from a front face of a crystalline silicon solar cell comprises:

S1: depositing an $Al_2O_3$ film, an $SiO_2$ film, and an $SiN_x$ film on a back face of a silicon wafer to form a backside passivation film, and forming an undesired coating on an edge of the front face of the silicon wafer;

S2: preparing an aqueous film on a surface of the backside passivation film of the product obtained in S1;

S3: passing the product obtained in S2 through an acid tank to remove the undesired coating;

S4: passing the product obtained in S3 through a water tank to remove a residual treatment solution; and S5: drying the product obtained in S4.

According to the disclosure, removing an excess passivation film alleviates the problem of an undesired coating on a front face of a tubular crystalline silicon solar PERC. In addition, the backside passivation film of $Al_2O_3/SiO_2/SiN_x$ differs from the backside passivation film of $Al_2O_3/SiN_x$ of the existing cell in that an $SiO_2$ film is added between the conventional backside passivation films $Al_2O_3/SiN_x$, thereby improving the hydrophilicity of the aqueous film, and helping remove the undesired coating from the front face of the silicon wafer and prevent the backside passivation film from being corroded by a gas phase. According to the disclosure, the undesired coating on the front face of the silicon wafer is removed, that is, metal ions on the front face of the silicon wafer are removed, thereby avoiding recombination caused by metal ions. Therefore, both the appearance of a cell and the photoelectric conversion efficiency of the cell are greatly improved.

In a class of this embodiment, the acid tank is an HF/HCl tank.

In a class of this embodiment, following S4, the product obtained in S4 is passed through a hydrochloric acid tank to remove excess metal ions, and then passed through a water tank to remove a residual treatment solution; then S5 is performed. Removing excess metal ions on the silicon wafer can further improve the photoelectric conversion efficiency of the cell.

In a class of this embodiment, a thickness of the $SiO_2$ film is 2-10 nm, which improves the passivation effect and makes it possible to form a good aqueous film in a next step.

In a class of this embodiment, in an HF/HCl solution, a volume ratio of HF is 40% to 60%, and a volume ratio of HCl is 5% to 20%.

In a class of this embodiment, in a hydrochloric acid solution, a volume ratio of HCl is 30%.

In a class of this embodiment, the crystalline silicon solar cell is a PERC-type cell.

In a class of this embodiment, S1 is performed in the tubular plasma film deposition machine.

In a class of this embodiment, according to the disclosure, preparation is completed on a chain cleaning machine. A belt speed of the chain cleaning machine is related to a tank. In S2 to S5, time taken for the silicon wafer to pass through corresponding work stations is 1-2 minutes.

The following advantages are associated with the method of the disclosure:

(1) According to the disclosure, removing an excess passivation film that is formed on an edge of the front face of the silicon wafer deposited with a backside passivation film alleviates the problem of an undesired coating on a front face of a tubular crystalline silicon solar PERC. According to the disclosure, the undesired coating on the front face of the silicon wafer is removed, that is, metal ions on the front face of the silicon wafer are removed, thereby avoiding recombination caused by metal ions. Therefore, both the appearance of a cell and the photoelectric conversion efficiency of the cell are greatly improved.

(2) The backside passivation film of $Al_2O_3/SiO_2/SiN_x$ according to the disclosure differs from the backside passivation film of $Al_2O_3/SiN_x$ of the existing cell in that an $SiO_2$ film is added between the conventional backside passivation films $Al_2O_3/SiN_x$, thereby improving the hydrophilicity of the aqueous film, and helping remove the undesired coating from the front face of the silicon wafer and prevent the backside passivation film from being corroded by a gas phase.

(3) Optionally, according to the disclosure, after the undesired coating is removed from the silicon wafer, the silicon wafer is passed through a hydrochloric acid tank to remove excess metal ions, thereby further improving the photoelectric conversion efficiency of the cell.

BRIEF DESCRIPTION OF THE DRAWINGS

The invention is described hereinbelow with reference to accompanying drawings, in which the sole FIGURE is a block diagram of a method for removing an undesired coating from the front face of a crystalline silicon solar cell according to Example 1 of the disclosure.

DETAILED DESCRIPTION

Example 1

FIG. 1 shows a method for alleviating a problem of an undesired coating on a front face of a tubular crystalline silicon solar PERC. The method is totally completed on a chain cleaning machine, and comprises:

S1: sequentially depositing an $Al_2O_3$ film, an $SiO_2$ film, and an $SiN_x$ film on a back face of the silicon wafer in a tubular plasma film deposition machine to form a backside passivation film, where because a stuck point on a graphite boat does not firmly jam the silicon wafer, an undesired coating is formed on an edge of a front face of the silicon wafer; to form a good aqueous film in a next step and improve a passivation effect, a thickness of the $SiO_2$ film is preferably 2-10 nm;

S2: preparing an aqueous film on a surface of the backside passivation film of the product obtained in S1, where the aqueous film covers the entire backside passivation film; the aqueous film is prepared in such a way that water is dripped on the surface of the backside passivation film, and the water does not fall when the machine vibrates; additionally arranging the $SiO_2$ film between the conventional backside passivation films $Al_2O_3/SiN_x$ improves the hydrophilicity of the aqueous film, and helps remove the undesired coating from the front face of the silicon wafer and prevent the backside passivation film from being corroded by a gas phase in a subsequent process;

S3: passing the product obtained in S2 through an HF/HCl tank to remove the undesired coating, where in an HF/HCl solution, a volume ratio of HF is 55%, and a volume ratio of HCl is 10%; by way of example, time taken for the product to pass through the HF/HCl tank is 1.5 minutes;

S4: passing the product obtained in S3 through a water tank to remove a residual HF/HCl solution; optionally, passing the product through a hydrochloric acid tank to remove excess metal ions, where in a hydrochloric acid solution, a volume ratio of HCl is 30%; by way of example, time taken for the product to pass through the hydrochloric acid tank is 1 minute; and then passing the resulting product through a water tank to remove a residual hydrochloric acid solution, and then going to S5; and S5: drying the product obtained in S4 with hot air at around 80° C. Then, a front-face passivation film is deposited on the prepared semi-finished product to form a cell.

Example 2

This embodiment differs from Embodiment 1 in that in S3, in an HF/HCl solution, a volume ratio of HF is 40%, a volume ratio of HCl is 5%, and time taken for a product to pass through an HF/HCl tank is 2 minutes. In S4, time taken for the product to pass through a hydrochloric acid tank is 2 minutes.

Example 3

This embodiment differs from Embodiment 1 in that in S3, in an HF/HCl solution, a volume ratio of HF is 60%, a volume ratio of HCl is 20%, and time taken for a product to pass through an HF/HCl tank is 1 minutes. In S4, time taken for the product to pass through a hydrochloric acid tank is 1 minute.

A belt speed of a chain cleaning machine is related to a tank. In some embodiments, in S2 to S5, time taken for a silicon wafer to pass through corresponding work stations is preferably 1-2 minutes. In some embodiments, in an HF/HCl solution, a volume ratio of HF is 40% to 60%, and a volume ratio of HCl is 5% to 20%.

The embodiments of the disclosure are not limited to the foregoing description. Based on the foregoing description of the disclosure, various other forms of modifications, replacements, or changes may be further made to the disclosure by using common technical knowledge and conventional methods in the field without departing from the foregoing basic technical ideas of the disclosure, and these modifications, replacements, or changes shall fall within the protection scope of the disclosure.

It will be obvious to those skilled in the art that changes and modifications may be made, and therefore, the aim in the appended claims is to cover all such changes and modifications.

What is claimed is:

1. A method, comprising:
    S1: depositing an $Al_2O_3$ film, an $SiO_2$ film, and an $SiN_x$ film on a back face of a silicon wafer to form a backside passivation film, and forming an undesired coating on an edge of a front face of the silicon wafer;
    S2: preparing an aqueous film on a surface of the backside passivation film and obtaining a first product;
    S3: passing the first product through an acid tank to remove the undesired coating, and obtaining a second product;
    S4: passing the second product through a water tank to remove a residual treatment solution, and obtaining a third product; and
    S5: drying the third product.

2. The method of claim 1, further A method, comprising:
    S1: depositing an $Al_2O_3$ film, an $SiO_2$ film, and an $SiN_x$ film on a back face of a silicon wafer to form a backside passivation film, and forming an undesired coating on an edge of a front face of the silicon wafer;
    S2: preparing an aqueous film on a surface of the backside passivation film, and obtaining a first product;
    S3: passing the first product through an acid tank to remove the undesired coating, and obtaining a second product;
    S4: passing the second product through a water tank to remove a residual treatment solution, and obtaining a third product;
    S5: passing the third product through a hydrochloric acid tank comprising a hydrochloric acid solution to remove excess metal ions, and then through a water tank to remove a residual treatment solution, and obtaining a fourth product; and
    S6: drying the fourth product.

3. The method of claim 1, wherein a thickness of the $SiO_2$ film is 2-10 nm.

4. The method of claim 2, wherein a thickness of the SiO$_2$ film is 2-10 nm.

5. The method of claim 1, wherein the acid tank is an HF/HCl tank comprising an HF/HCl solution.

6. The method of claim 5, wherein in the HF/HCl solution, a volume ratio of HF is 40% to 60%, and a volume ratio of HCl is 5% to 20%.

7. The method of claim 2, wherein in the hydrochloric acid solution, a volume ratio of HCl is 30%.

8. The method of claim 1, wherein a time for any step of S2 to S5 is 1-2 minutes.

9. The method of claim 1, wherein S1 is performed in a tubular plasma film deposition machine.

10. The method of claim 1, wherein S2 to S5 are performed by a chain cleaning machine.

* * * * *